(12) United States Patent
Berr et al.

(10) Patent No.: US 6,271,665 B1
(45) Date of Patent: Aug. 7, 2001

(54) EXTRA SLICE SPIN TAGGING (EST) MAGNETIC RESONANCE IMAGING FOR DETERMINING PERFUSION

(76) Inventors: Stuart S. Berr, P.O. Box 268, Batesville, VA (US) 22924; Vu Minh Mai, 84 Langley Rd., Apt. Basement, Brighton, MA (US) 02135

( * ) Notice: Subject to any disclaimer, the term of this patent is extended or adjusted under 35 U.S.C. 154(b) by 0 days.

(21) Appl. No.: 09/388,740

(22) Filed: Sep. 2, 1999

Related U.S. Application Data (60) Provisional application No. 60/098,810, filed on Sep. 2, 1998.

(51) Int. Cl.$^7$ .............................. G01V 3/00; G01R 33/20
(52) U.S. Cl. ......................... 324/306; 324/307; 324/309; 600/419
(58) Field of Search .................................. 324/306, 309, 324/307; 600/419

(56) References Cited

U.S. PATENT DOCUMENTS 5,402,785 * 4/1995 Leigh et al. ..................... 600/419
5,846,197 * 12/1998 Edelman ........................... 600/419

OTHER PUBLICATIONS

D Le Bihan, et al, MRI of intravoxel incoherent motions. Applications to diffusion and perfusion in neurological disorders. Radiology, 161:401–7, 1986. no month.*
Helpen JA Branch CA Yongbi MN. Huang NC. MR perfusion imaging in human brain using the UNFAIR technique. Un–inverted flow–sensitive alternating inversion recovery Magnetic Resonance Imaging. 15(2):135–9, 1997. no month.*
Detre JA, Leigh JS, Williams DS, Koretsky AP , Perfusion Imaging, Magnetic Resonance Medicine, 23(1):37–45, 1992. no month.*
Williams DS, Detre JA, Leigh JS, Koretsky AP, Magnetic resonance imaging of perfusion using spin inversion of arterial water. Proceedings National Academic Science, 89:212–216, Jan. 1992.*
Edelman RR, Siewert B, Darby DG, Thangaraj V, Nobre AC, Mesulam MM, Warach S. Qualitative mapping of cerebral blood flow and functional localization with echo–planar MR imaging and signal targeting with alternating radiofrequency. Radiology, 192:513–520, 1994.*
Kim S–G, Quantification of relative cerebral blood flow change by flow–sensitive alternating inversion recovery technique; Application to functional mapping. MRM, 34:293–301, 1995. no month.*

* cited by examiner

Primary Examiner—Christine Oda
Assistant Examiner—Tiffany A. Fetzner (57) ABSTRACT

A magnetic resonance technique to measure perfusion of fluid to tissue by inverting all the spins in fluid water hydrogen nuclei of the subject with a non-spatially-selective radiofrequency (RF) pulse and immediately reinverting the spins in an imaging plane of interest such that the spins in the imaging plane experience minimal perturbation of their magnetization while the spins outside the plane (extraslice) are inverted (tagged). To account for signal loss effects of magnetization transfer (MT), a control image is obtained by applying two non-selective inversion pulses and creating a perfusion-weighted image by subtracting the tagged image from the control image. When this tagged image is subtracted from a "control" image, the resulting intensity arises solely from the tagged spins that have flowed into the imaging plane. This resultant image is referred to as a perfusion weighted image, because its intensity is a function of the rate of perfusion into the imaging plane. The intensity is also a function of the relaxation rate of the inflowing spins, the partition coefficient of the spins, and the relaxation rate of the stationary tissue. Estimates on these values can be made and can be used to calculate a perfusion map, which is an image that is created in which the intensity of each voxel is proportional to the perfusion of spins into the voxel. EST MRI is entirely noninvasive and overcomes some of the problems associated with the other noninvasive MRI techniques.

11 Claims, 6 Drawing Sheets

Fig. 1

Nonselective 180° RF
pulse inverts all the
spins in RF coil.

Fig. 2A

Selective 180° RF
pulse re-inverts the spins
in the imaging plane.

Fig. 2B

A delay time
allows inverted spins
to perfuse into the
imaging plane.
Image data is then acquired.

Fig. 2C

Nonselective 180° RF pulse inverts all the spins in the RF coil.

Nonselective 180° RF pulse re-inverts all of the spins in the RF coil, imparting the same MT effects as arise in the Tag Image.

Use the same delay times as for the Tag Image (Fig. 2) and acquire image data.

EXTRA SLICE SPIN TAGGING (EST) MAGNETIC RESONANCE IMAGING FOR DETERMINING PERFUSION

CROSS-REFERENCE TO RELATED APPLICATIONS

The present application claims the benefit of the earlier filing date of U.S. Provisional Patent Application Ser. No. 60/098,810, filed Sep. 2, 1998, which is incorporated by reference herein in its entity.

FIELD OF THE INVENTION

The present invention related generally to the field of perfusion measurement and more particularly to the field of methods of measuring perfusion using non-invasive imaging techniques.

BACKGROUND OF THE INVENTION

Perfusion of blood to tissue is extremely important to cell and organ viability. Lack of blood flow, or ischemia, can lead to the deleterious consequences associated with stroke, myocardial infarction, kidney failure, pulmonary embolism, avascalar necrosis of the hip, etc. There are also abnormal conditions that may result in increased blood flow that would be useful to noninvasively assess, such as is found in certain tumors, uterine fibroids, avascular malformations, and the like.

There are a number of methods that have been developed over the years to determine amounts of blood flow using freely diffusible. A nonradioactive isotope of xenon has been used as a contrast agent in X-ray Computed Tomography (CT). A radioactive isotope of xenon has been radionuclide tracer studies. However, xenon is an anesthesia and must be used with caution. Radioactive isotopes of oxygen and fluorine have been used for assessment of blood flow via PET imaging techniques. Although these techniques are useful, their invasive nature has limited widespread implementation. Magnetic resonance imaging (MRI) methods offer the possibility of noninvasively determining perfusion.

MRI has traditionally used exogenous contrast agents injected intravenously in order to measure blood flow. The most commonly used agents are chelates of metals (gadolinium and manganese) that enhance longitudinal (T1) relaxivity and result in bright areas on T1 weighted images. The change in intensity can be used to calculate perfusion rates. The most commonly used MRI contrast agent is gadolinium diethylenetriamine pentaacetic acid (Gd-DTPA). This is introduced into the bloodstream by intravenous injection. As the coast agent flows into the tissue area where an image will be acquired (the imaging plane), it produces a unique signal that can be imaged through a variety of image acquisition techniques. Using contrast agents has a number of drawbacks, however, including: 1) the need for rapid imaging to capture the first pass of the contrast agent before it enters the veins, which could produce signal that can interfere with the arteries; 2) the need for accurate timing to begin the image acquisition to ensure bright arterial and dark venous signal; 3) inability to signal average to improve image quality due to the rapidly moving contrast agent; 4) possible adverse patient reaction to the contrast agent; and 5) cost of the contrast agent, especially in high-dose perfusion imaging experiments, in which the use of double- or triple-dose contrast could add hundreds of dollars to the cost of the exam.

MRI methods have been developed that are based on the use of water in the blood as an endogenous agent to produce image contrast. The advantage of this class of methods is that these techniques are entirely noninvasive and repeated measurements can be made for long periods of time. One of the first attempts to use blood water as an endogenous tracer was by Denis Le Bihan, et al. who used large magnetic field gradients to sensitize the image to small motions, including diffusion and perfusion. The problems associated with Le Bihan's method is that it is extremely sensitive to bulk motion and that it is difficult to segregate the contributions of perfusion to changes in signal intensity.

Another class of techniques involves measuring the signal difference between a image acquired after excitation ("tagging") of spins outside an imaging plane and an image acquired without exciting the spins outside the imaging plane. The signal difference between these two images is due to perfusion of tagged spins from outside the imaging plane to inside the imaging plane. This class of techniques is commonly referred to as Arterial Spin Tagging (AST) or Arterial Spin Labeling (ASL).

This class of imaging techniques creates contrast through the use of strategies that tag spins that subsequently flow into the imaging plane. The resulting image data can be used to produce either a perfusion-weighted image or can be used to calculate a perfusion map where intensities are proportional to flow in ml/100 $g_{tissue}$min. The mathematics used to produce the perfusion maps is derived from steady-state equations for the kinetics of a freely diffusible tracer.

One of the original AST methods is described in U.S. Pat. No. 5,402,785 of Leigh, et al. and in the articles of Detre, et al. and Williams, et al. This imaging sequence tags spins flowing through a plane proximal to the imaging plane either with an inversion (180°) or saturation (90°) RF pulse. The spins flow into the imaging plane and decrease the signal. The effect of perfused spins into the imaging plane is determined by subtracting the tagged image from a control image. The tagged image not only has signal decrease from tagged blood, but from magnetization transfer (MT) saturation caused in the imaging plane by the off-resonance tagging pulse. In order to account for this, a "tagging" pulse is applied an equal distance on the distal side of the imaging plane.

There are several drawbacks to this method. (1) The RF pulses must be applied for long period in order to allow the tagged spins to reach a steady-state in the imaging plane. This can lead to SAR (specific absorption rate) problems. (2) As the spins are being tagged in the distal plane, previously excited spins are losing their tag in the imaging plane due to longitudinal T1 relaxation. (3) The tagging plane must be carefully placed in order to tag inflowing spins. This is not so hard to do in the head where tagging can be performed using a axial plane through the carotid arteries. Tagging the heart and other parts of the body would be difficult. (4) The tagging in the control image can result in the excitation of spins in the venous blood.

U.S. Pat. No. 5,846,197 of Edelman, et al., and the article of Edelman, et al., describe another method called Signal Targeting with Alternating Radiofrequency (STAR) which is similar to Leigh's method but uses a non-steady state tagging of arterial spins by inverting a thick slab proximal to the imaging plane proximal to the imaging plane. The tagged image is acquired and subtracted from a control image in which no tagging is performed. The disadvantages of this technique are similar to Leigh's method in that the tagging plane must be carefully placed. Another disadvantage of STAR is that it did not (as originally proposed) properly account for signal loss due to MT effects.

The other category of spin-tagging techniques involve tagging spins on a "slice" of tissue centered on the imaging plane. Existing methods are FAIR (Flow-sensitive Alternating Inversion Recovery) by Kim et al.; UNFAIR (Uninverted Flow-sensitive Alternating Inversion Recovery, by Helpern et al.; and FIBB (Functional Imaging with pulsed Black Blood).

FAIR (S. G, Kim) is an imaging method that acquires two images: One following a spatially selective RF pulse and one following a nonselective pulse. The difference between the two images yields a perfusion weighted image. One of the main drawbacks with FAIR is the dependence on the order of image subtraction between the control image and the tagged image. FAIR has all spins in the imaging plane inverted. The tissue spins in the imaging plane relax back towards a ground state. In the tagged image, water spins that are fully relaxed from outside the imaging plane flow into the tissue and cause the tissue to relax faster than in the control image (in which the water spins from outside the imaging plan are inverted). Different issues have different $T_1$, which is to say they will relax at different rates. After the initial inversion pulse, spins are inverted and have a large, negative signal. As they relax, they pass through the x-y plane, at which point they produce no signal. They continue to relax until they align with the positive z-axis, and have maximal positive signal. Thus the signal goes big to small to big. Different tissues do this at different rates. One advantage that EST has over FAIR is that the order of image subtraction does not change as a function of time after inversion (Ti), i.e., in EST the tag image is always subtracted from the control image. In areas where there are tissues with different longitudinal relation times ($T_1$), (such as the brain with gray and white matter), there are values of $T_1$ where one cannot choose a proper order of image subtraction for FAIR; One order will improperly zero the gray matter and the other order will improperly null white matter. EST does not have this problem.

Another method, UNFAIR (Helpern et al.) as originally proposed uses two selective inversion pulses, one of which is wider than the other. This leaves the stationary tissue at equilibrium values and the spins of the water inverted in the tagged image. Use of a wide selective tagging pulse introduces potential error into image data, particularly for fast-flow tissue such as kidney. Perfusion is observed by observing spins from the periphery of the imaging plane (inverted by a wide selective pulse) that have flowed into the imaging plane (whose spins are reinverted by the narrow selective pulse). Error will occur when equilibrium spins of fluid outside the wide, inverted area flow into the imaging plane. Such untagged equilibrium spins will have a signature nearly identical to the reinverted spins in the imaging plane, this will cancel out some of the signal of inverted spins flowing into the plane. Thus, UNFAIR may show less perfusion than actually exists. EST avoids this problem by inverting all spins outside the imaging plane. Another disadvantage of the UNFAIR method is that it acquires one line of k-spacer per tag, which limits the amount of data and thereby the spatial resolution that can be obtained in a reasonable amount of time. This method has only been demonstrated to using a 64×64 matrix. This 64×64 matrix required 64 separate excitations, followed by time to allow the spins to relax (referred to as the TR). TR is typically 3–4 seconds, so this low resolution image would require 3–4 minutes. A 256×256 image with 4 signal averages would require close to 70 minutes per slice, which is too long to be clinically useful.

REFERENCES

1. Detre J A, Leigh J S, Williams D S, Koretsky A P, Perfusion Imaging, Magn Reson Med, 23(1):37–45, 1992.
2. Williams D S, Detre J A, Leigh J S, Koretsky A P. Magnetic resonance imaging of perfusion using spin inversion of arterial water. Proc Natl Acad Sci, 89:212–216, 1992.
3. Edelman R R, Siewert B, Darby D G, Thangaraj V, Nobre A C, Mesulam M M, Warach S. Qualitative mapping of cerebral blood flow and functional localization with echo-planar MR imaging and signal targeting with alternating radiofrequency. Radiology, 192:513–520, 1994.
4. Kim S-G, Quantification of relative cerebral blood flow change by flow-sensitive alternating inversion recovery technique; Application to functional mapping. MRM, 34:293–301, 1995.
5. D Le Bihan, et al, MRI of intravoxel incoherent motions. Applications to diffusion and perfusion in neurological disorders. Radiology, 161:401–7, 1986.
6. Helpern J A. Branch C A. Yongbi M N. Huang N C. MR perfusion imaging in human brain using the UNFAIR technique. Un-inverted flow-sensitive alternating inversion recovery. Magnetic Resonance Imaging 15(2):135–9, 1997.

BRIEF SUMMARY OF THE INVENTION

This invention is called Extraslice Spin Tagging (EST) MRI because it uses a series of spatially selective pulses to "tag" spins outside an imaging plane. These spins flow into the imaging plane over a few second period and decrease the image intensity. When this tagged image is subtracted from a "control" image, the resulting intensity arises solely from the tagged spins that have flowed into the imaging plane. This resultant image is referred to as a perfusion weighted image, because its intensity is a function of the rate of perfusion into the imaging plane. The intensity is also a function of the relaxation rate of the inflowing spins, the partition coefficient of the spins, and the relaxation rate of the stationary tissue. Estimates on these values can be made as described in the Detailed Description of the Invention and can be used to calculate a perfusion map, which is an image that is created in which the intensity of each voxel is proportional to the perfusion of spins into the voxel. EST MRI is entirely noninvasive and overcomes some of the problems associated with the other noninvasive MRI techniques mentioned above.

BRIEF DESCRIPTION OF THE DRAWINGS

The present invention will be better understood, and its numerous objects and advantages will become apparent to those of skill in the art by reference to the following detailed description of the invention when taken in conjunction with the following drawings.

FIG. 1 is a schematic that outlines the pulse sequence algorithm for acquisition of the data necessary to obtain a perfusion weighted image and/or a perfusion map. Period A consists of the non-spatially selective RF pulse. Period B, occurring a short time after the non-spatially selective RF pulse (typically 1 millisecond (ms)), consists of a spatially selective RF pulse that re-inverts the nuclear spins in the imaging plane back to equilibrium magnetization. Period C consists of the acquisition of the image data. This data collection will typically employ a rapid acquisition scheme, such as fast spin echo, rapid gradient echo, echo planar, HASTE (half-Fourier acquisition single-shot turbo spin echo), echo planar imaging, GRASE (gradient and spin echo), and the like.

FIG. 3 is similar to FIG. 2, except that the reinversion pulse in (B) is non-spatially selective. This reinverts all the spins in the RF coil, and imparts that same MT effects caused by the pulses in the tagging shown in FIG. 2. (C) The same time delay used after the tagging for the first image is used, followed by collection of image data.

FIG. 4 shows the signal intensity of a pixel after Extraslice Spin Tagging. The control magnetization [M(control)] remains at unity while the inverted water spins in the arterial blood [M(arterial)] both relaxes and flow into the imaging plane. The resultant intensity [M(resultant)] depends on the flow rates, the amount of tissue water replaced with arterial water, and the $T_I$ and $M_o$ of the water in the blood.

FIG. 5 shows the complete reinversion of nuclear spins in the imaging plane.

FIG. 6 shows a representative set of images obtained from a human volunteer.

DETAILED DESCRIPTION OF THE INVENTION

This invention describes a method to measure perfusion designated Extraslice Spin Tagging (EST) magnetic resonance imaging (MRI). This method will be useful in determining perfusion in any substance having a well defined fluid supply, such as any tissue having a well defined arterial flow (including, but not limited to, the liver, heart, brain, muscles, cancerous tissue, and kidney). All questions addressing the scope of the present invention may be resolved by reference to the specification and the attached claims.

The intensity in images obtained using magnetic resonance imaging is a function of many factors, including nuclear spin density, relaxation rates (commonly T1 and T2), motion, and others. The way in which the data is collected determines the influence of the various intrinsic factors on the image intensity. Unlike X-ray imaging that is sensitive only to electron density, MRI can afford clinicians a wealth of information due to its reliance on so many tissue characteristics. We have invented a means to create MR images sensitive to inflow of spins (commonly the hydrogen on water in blood) using noninvasive techniques. These flow sensitive images are referred to as Perfusion Weighted Images. We also present the means to quantitatively calculate the flow rates on a voxel-by-voxel basis to create a perfusion map.

To obtain perfusion weighted images, two separate images are acquired: A Tag Image and a Control Image. The perfusion weighted image is obtained by subtraction of the Tag Image from the Control Image. The Tag Image is acquired in the following manner (see FIGS. 1 and 2). The nuclear spins that reside within the radiofrequency (RF) imaging coil are tagged by the application of a non-spatially selective 180° inversion RF pulse (see FIG. 1, point A, and FIG. 2A). As soon as possible after this (typically 1 ms), a spatially selective 180° re-inversion RF pulse is applied to the nuclei in the imaging plane in conjunction with a magnetic field gradient (see FIG. 1, point B, and FIG. 2B). As a result, the nuclear spins in the imaging plane are returned to their original, equilibrium magnetization state. A time delay ensues in order to allow time for the tagged spins to flow into the imaging plane (see FIG. 1, time period labeled TI). This inversion time (TI) after the tagging period is followed by a rapid image collection period. This strategy is important to making the technique useable clinically. After the data acquisition, a long time period must be used to ensure all spins in the RF coil have returned to equilibrium (typically several seconds). If multiple lines of data are not collected following each tag, the imaging time becomes prohibitively long. We have employed several fast imaging schemes to collected data. These include, but are not limited to fast spin echo, rapid gradient echo, echo planar, HASTE (half-Fourier acquisition single-shot turbo spin echo), echo planar imaging, and GRASE (gradient and spin echo).

Figure 1:
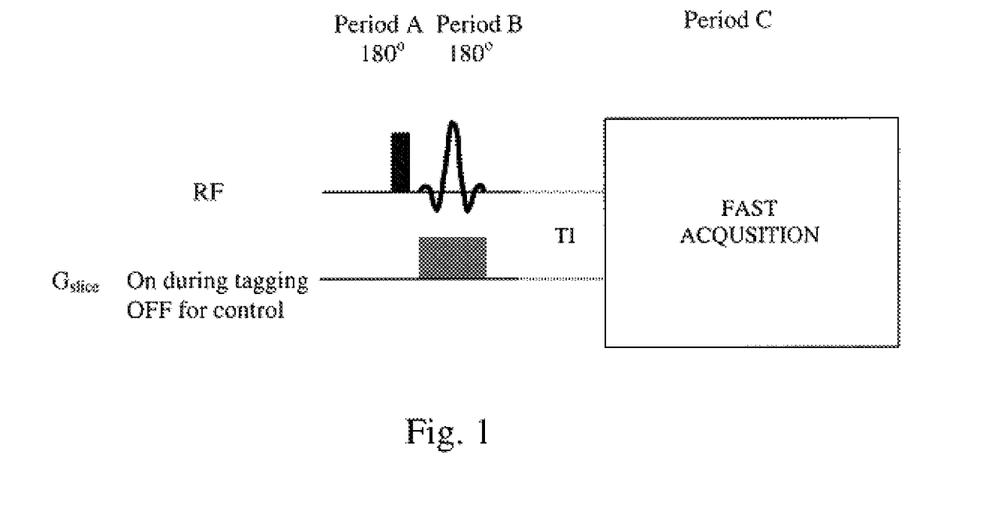
Figure 2A:
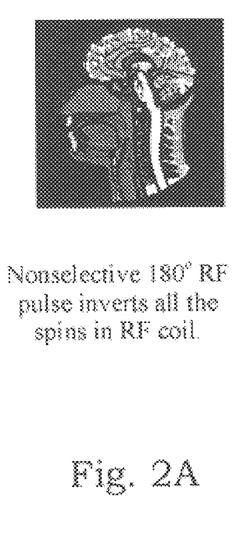
FIG. 2 illustrates that spatial relationship between the tagging pulses and the imaging plane resulting from the application of the RF and gradient pulses schematized in FIG. 1. (A) All the nuclear spins are inverted by a non-spatially selective RF pulse. (B) A selective RF pulse re-inverts the nuclear spins in the imaging plane to equilibrium magnetization. (C) A time delay ensures the previous pulses (on the order of a couple of seconds) in order to allow the inverted nuclear spins to enter into the imaging plane. The image data is then collected.
Figure 2B:
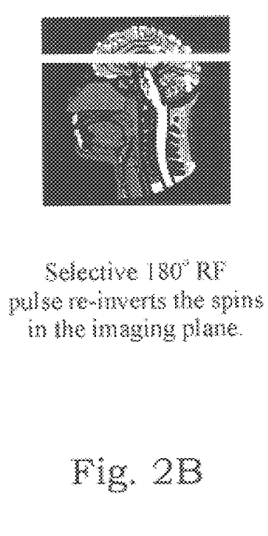
Figure 2C:
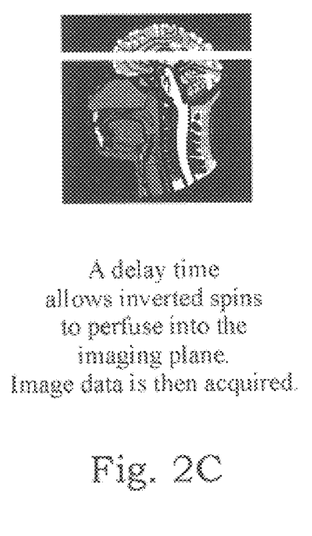

As the tagged nuclear spins flow into the imaging plane, the re-inverted nuclear spins in the imaging plane are affected in two ways. First, the image intensity decreases as a function of the perfusion rate, the partition coefficient and the T1 relaxation time. Second, there is a slight decrease in the signal due to the on-resonance magnetization transfer (MT) between tissue water and macromolecules.

Figure 3A:
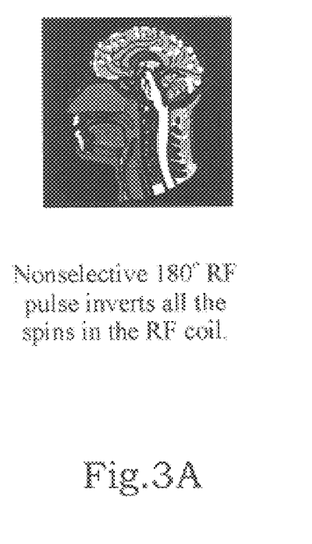
Figure 3B:
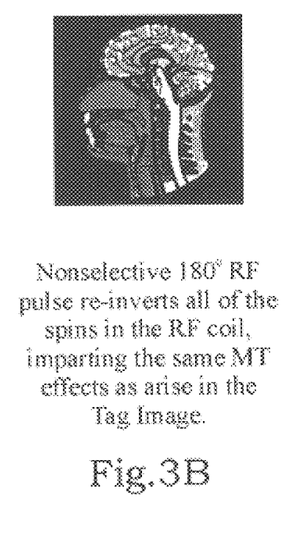
Figure 3C:
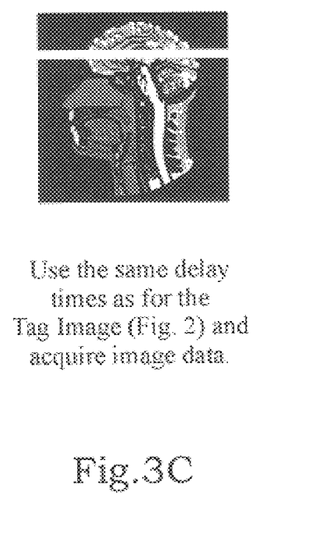
Figure 4:
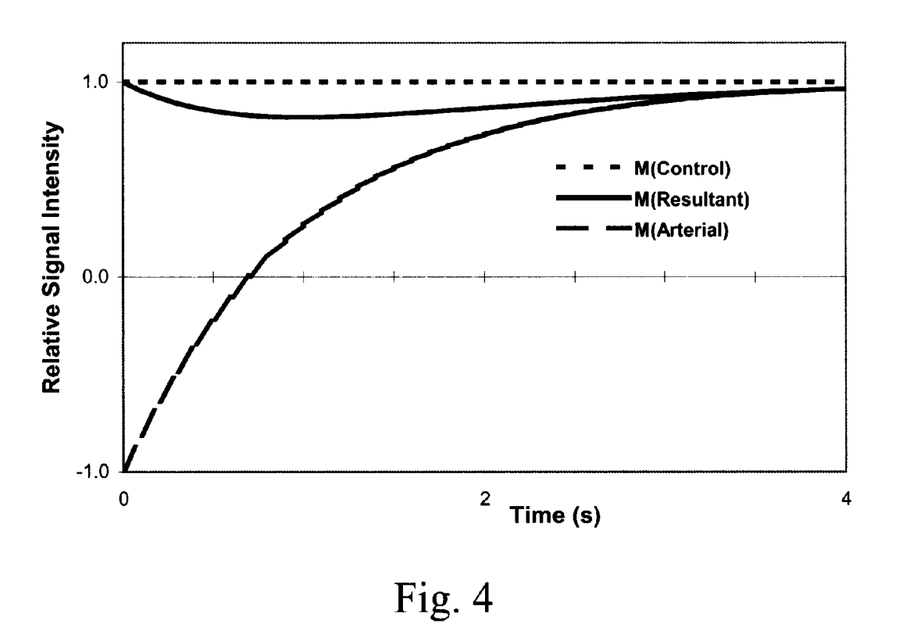

The Control Image (FIGS. 1 and 3) is acquired using the same procedure described above, with the exception that the magnetic field gradient is removed during the second 180° inversion pulse at time B (FIG. 1, point B and FIG. 3B). As a result, all nuclear spins in the RF coil are returned to their original spin states. However, the spins in the imaging plane experience the same MT effects as they do during the acquisition of the tagged image. As a result, the subtracted image intensity is due only to the inflowing spins. Imaging is performed in the same manner as for the tagged image (see FIG. 1, point C and FIG. 3C).

The subtraction of the tag image from the control image produces a perfusion weighted image. However, quantitative perfusion values can be calculated if more measurements are made. The values are then calculated on a pixel-by-pixel basis and result in a perfusion map, which is an image where the intensity is proportional to the flow rates. The calculation of the perfusion map uses the tag and control images to determine the pixel intensities $M_b(t)$ and $M_b^o$, respectively. A T1 map is then determined by running a series of Inversion Recovery centric reordered turbo Fast-Low Angle Shot (FLASH, a rapid gradient echo imaging sequence) images with increasing TI (10,20,50,100,200,500,1000, 2000,5000, and 10000 ms). Curve fitting is performed on the set of intensity values for each pixel to determining a T1 map. A monoexponential curve was assumed. Because we used magnitude images, it is not clear whether the minimum value in this fitted curve is negative or positive. Therefor the minimum was discarded in the fit. But we still have 9 values for the fit, which is more than sufficient. Points at shorter TIs than the minimum were negated. In order to calculate the perfusion values for each pixel, the Bloch equation was solved using an added term for perfusion (Williams, et al.):

$$M_b(t) = M_b^a \frac{\left(1 - \frac{fTI}{\lambda}\right) + \frac{2fTI}{\lambda} e^{-\left(\frac{1}{TI} + \frac{f}{\lambda}\right)t}}{1 + \frac{fTI}{\lambda}} \quad (1)$$

$$\frac{1}{TI_{abs}} = \frac{1}{TI} + \frac{f}{\lambda} \quad (2)$$

For non-steady-state, we can replace equation (2) into the exponential term in equation (1), and it is now:

$$M_b(t) = M_b^a \frac{\left(1 - \frac{fTI}{\lambda}\right) + \frac{2fTI}{\lambda} e^{-\frac{t}{TI_{abs}}}}{1 + \frac{fTI}{\lambda}} \quad (3)$$

Solving for f in equation (3) after some manipulation to replace $T_{Iobs}$ with $T_I$, we get the equation to calculate perfusion for non-steady-state cases:

$$f = \frac{\lambda}{2TI_{abs}} \frac{1}{1 - e^{-\frac{t}{TI_{abs}}}} \frac{M_b^a - M_b(t)}{M_b^a} \quad (4)$$

f = perfusion rate (ml/gs).
$M_b^a$ = pixel intensity from control image.
$M_b(t)$ = pixel intensity from tagged image acquired at some $t$ after the inversion
$T_1$ = longitudinal relaxation rate of tissue in absence of perfusion.
$TI_{abs}$ = measured $T_1$ values.
$\lambda$ = blood:tissue partition coefficient (ml/g).

Results from this analysis are presented below. The pixel intensifies in the perfusion image are equal to the perfusion rates in ml/(100 gmin). There are some areas of high intensity from large vessels that we threshold out of the final perfusion nap in order to allow for better control of window and center of the image.

EXAMPLE 1

Figure 5A:
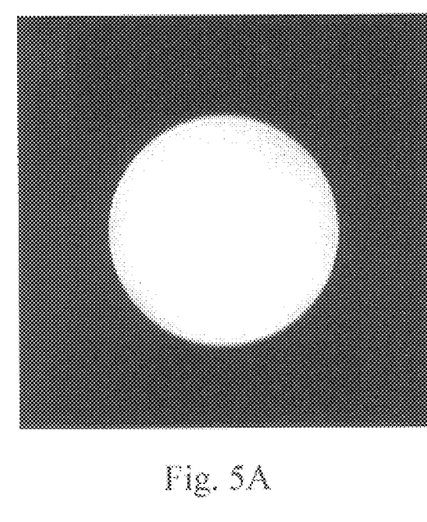
FIG. 5a shows the control image of a stationary phantom.
Figure 5B:
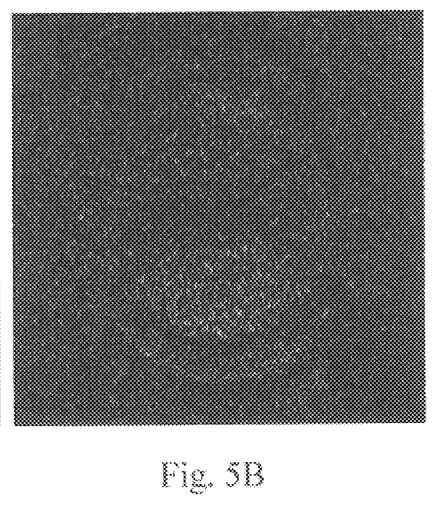
FIG 5b shows the difference image of the tagged phantom image subtracted from the control phantom image. The minimal difference in intensities in the difference image indicate that the perfusion images obtained in vivo are not due to slice profile imperfections or other sequence imbalances.

Extraslice spin tagging was used to determine perfusion in the human brain. Perfusion images were obtained for five healthy volunteers (four male and one female) with an average age of 30 years. Images were obtained using a Siemens VISION 1.5T MR system using a quadrature head coil. The pulse sequence used is that described in the Detailed Description of the Invention and FIG. 1. Briefly, to obtain tagged images, a non-spatially selective hyperbolic secant 180° RF pulse (inversion pulse) was applied to the subjects (FIG. 1, point A). The subjects were then subjected to a magnetic field gradient, followed by a spatially selective 18° RF pulse (FIG. 1, point B). The re-inversion pulse was applied 1 ms after the inversion pulse to allow for magnetic field gradient rise time. Subsequently, data was obtained using Rapid Gradient Echo sequence (in this case, FLASH sequence) (FIG. 1, point C). Control images were obtained in the same manner except that the magnetic field gradient was not applied (FIG. 1, point B). The magnetic field gradient applied during the tagging pulse is adjusted so that it is two-times wider than the imaging plane. This ensures that all the nuclei in the imaging plane have their spins re-inverted. To test for complete re-inversion of spins, tagged and control images were obtained from stationary phantoms (FIG. 5). The tagging pulses were 10.24 ms adiabatic hyperbolic secants. A time delay of TI is applied after the tagging pulse to allow the inverted spins to flow into the imaging plane.

Several rapid acquisition methods have been used with EST, including rapid gradient echo (RAGE), fast spin echo (FSE) and echo-planar imaging (EPI). The results in the current example were obtained using a centrically recorded, two dimensional RAGE sequence (called FLASH) with the following parameters: TR/TE=11.0/4.2 ms, slice thickness=5 mm, FOV=300 mm, matrix=128×128, TI=100, 300, 500, 830, 1000, 1500, 2000 and 3000 ms. Five measurements were acquired and averaged for the tagged and the control images, with a time delay between measurements of 4 seconds.

$T_I$ maps were acquired with images centrically reordered two-dimensional FLASH sequence with TR/TE=11/4.2 ms. An inversion pulse was applied, delayed by a time variable TI and then followed by image acquisition. The TI values used were 10, 20, 50, 100, 200, 500, 1000, 2000, 5000 and 10000 ms. Amplitude images were non-linearly fitted to produce the $T_I$ map on a pixel by pixel basis. The TI at which a minimum intensity occurred (TI min) was determined for each pixel. Intensities for TI<τ min were negated since the sign of the intensity for TI=TI min could not be determined. Pixels in which the non-linear algorithm failed would be assigned a 0 value. Pixels below a threshold value of 10% of the maximum were not fitted. Images for the $T_I$ calculation were performed with NEX=1. Total imaging time for the perfusion and $T_I$ data was roughly five minutes per imaging plane.

Figure 6A:
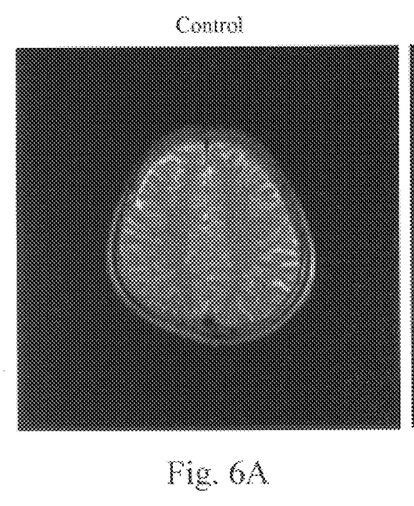
FIG. 6A shows a control image of the brain acquired with same image parameters as the tagged image except the extraslice spins are at equilibrium magnetization.
Figure 6B:
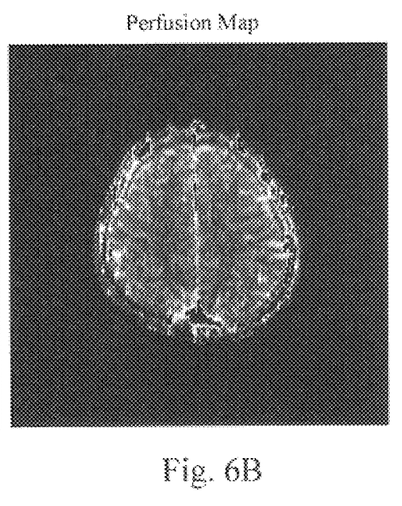
FIG. 6B shows a perfusion map calculated as explained in the detailed description of the invention. Brighter areas correspond to higher perfusion rates.

The signal differences from the tagged and control images were analyzed to determine the perfusion rate according to the equation:

$$M_c - M_t = [2M_c fTI \exp(-TI/T_I)]/\lambda \quad (5)$$

where $M_c$ is the magnitude of the control image (FIG. 6A), $M_t$ is the magnitude of the tagged image; f is the perfusion rate is ml 100 $g^{-1}min^{-1}$; TI is the time delay between the first non-spatially selective RF pulse and the spatially selective RF pulse; $T_I$ is the longitudinal relaxation rate of the pixel as determined from the $T_I$ map; and $\lambda$ is the blood/tissue partition coefficient. A perfusion map was created from this information by using the perfusion value in ml 100 $g^{-1}min^{-1}$ for the gray level value in the calculated image and is shown in FIG. 6B. This technique allows for the easy assessment of flow rates in different parts of the brain using the standard region of interest tools on the imaging system.

All subjects tested demonstrated rapid perfusion to the brain. The grey matter perfusion was roughly twice the rate of the white matter. The signal from the tagged spins lasted only 3–4 seconds after tagging (roughly 3–4 times T1). The average values for perfusion to different areas of the brain in ml 100 $g^{-1}min^{-1}$+/– standard deviation are as follows: global 71.4+/–7.6, gray matter 105.6+/–7.4, and white matter 44.0+/–27.8. Complete results for each of the volunteers tested is given in Table 1.

Table 1 represent perfusion values for the five subjects examined. The perfusion values are given in ml 100 $g^{-1}min^{-1}$;

| Volunteer | Global | Gray | White | age |
|---|---|---|---|---|
| A | 68.5 | 105.3 | 52.1 | 41 |
| B | 71.6 | 108.7 | 33.0 | 25 |
| C | 68.5 | 93.7 | 43.1 | 40 |
| D | 67.8 | 105.0 | 31.8 | 23 |
| E | 80.8 | 115.1 | 60.2 | 26 |
| Average | 71.4 | 105.6 | 44.0 | 31.0 |
| Standard Deviation | 5.4 | 7.8 | 12.2 | 8.7 |

What is claimed is:

1. A spin labeling magnetic resonance method for measuring perfusion of fluid into an area without the use of ionizing radiation or exogenous tracer and wherein the fluid outside the area is tagged prior to perfusion into said area, said method comprising the steps of:

(a) choosing an arbitrary area of interest to image;

(b) magnetically tagging nuclei in said fluid outside said imagining area using a nonselective radio frequency (RF) inversion pulse followed immediately by a selective RF pulse-magnetic field gradient combination coincident with the imaging plane which re-inverts spins in the imaging plane and leaves the spins outside the plane inverted (tagged);

(c) allowing time for the tagged nuclei to perfuse into said imaging area;

(d) collecting tag image information in a rapid manner and generating an image where the intensity is decreased by the tagged nuclei that have traveled into the imaging plane;

(e) collecting a control image in a manner exactly the same as that of the tagged images except that two non-selective RF pulses are used which leaves the spins outside the imaging plane untagged but imparts the same amount of signal loss due to magnetization transfer (MT);

(f) processing said images to create a perfusion weighted image by calculating on a pixel by pixel basis the difference between the tag and control image, for which the intensity is a function of the perfusion rates; or (g) processing said images to determine the quantity of said fluid per quantity of said mass of image volume per unit time which has perfused into said imaging area as a function of spatial location.

2. The method of claim 1, wherein the step of magnetically tagging nuclei comprises the step of partially or fully exciting or inverting the spins outside the imaging plane while keeping the spins in the imaging plane unperturbed.

3. The method of claim 2, wherein the magnetic field gradient associated with the RF pulse that restore spins to their equilibrium value is such that the width of pulse is greater than that used by the image acquisition pulses to ensure full restoration.

4. The method of claim 1, wherein said fluid is blood and said imaging area contains tissue, and said tagging further comprises the step of tagging hydrogen nuclei of water contained in the blood.

5. The method of claim 4, wherein said tissue is an organ and said tagged spins in the imaging plane of interest lie between the heart and the said organ.

6. The method of claim 5, wherein the organ of interest can be any in which the blood flow is high enough so that the said tagged spins flow into the said imaging plane before they relax back to equilibrium.

7. The method of claim 6, wherein the said organs with high blood flow include the kidneys, the brain, the lungs, the heart, the uterus, the ovaries, the prostate, the breasts, the eyes, and the liver.

8. The method of claim 4, wherein said tissue is an lesion and said tagged spins in the imaging plane of interest lie between the heart and the said lesion.

9. The method of claim 8, wherein the said lesion is a tumor, a hemangioma, a uterine fibroid.

10. The method of claim 1, wherein a quantitative perfusion map is created by using the tagged image, the control image, a T1 map of the tissue in the imaging plane, the T1 of the inflowing fluid, and the partition coefficient.

11. The method of claim 10, wherein the T1 map, which has the same image size as for the perfusion weighted image, is created by acquiring a number of images after an inversion pulse is applied and then performing an exponential fit to the measured image pixel values.

* * * * *